United States Patent
Miyake (10) Patent No.: US 8,963,269 B2
(45) Date of Patent: Feb. 24, 2015

(54) LIGHT-TRANSMISSIVE MEMBER, OPTICAL DEVICE, AND MANUFACTURING METHODS THEREOF

(75) Inventor: Takashi Miyake, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 53 days.

(21) Appl. No.: 13/592,759

(22) Filed: Aug. 23, 2012

(65) Prior Publication Data

US 2013/0056756 A1    Mar. 7, 2013

(30) Foreign Application Priority Data

Sep. 1, 2011    (JP) .................................. 2011-191076

(51) Int. Cl.
*H01L 31/0232*  (2014.01)
*H01L 33/58*  (2010.01)
*B32B 38/00*  (2006.01)
*H01L 31/18*  (2006.01)
*H01L 27/146*  (2006.01)

(52) U.S. Cl.
CPC ............ *H01L 31/0232* (2013.01); *H01L 31/18* (2013.01); *H01L 33/58* (2013.01); *H01L 27/14685* (2013.01); *H01L 27/14623* (2013.01)
USPC ............ 257/434; 257/E33.067; 257/E31.127; 438/65; 428/43; 428/157; 428/188

(58) Field of Classification Search
CPC ...................... H01L 2924/00; H01L 27/14685
USPC ............ 428/43, 188, 156, 157; 257/E33.067, 257/434

See application file for complete search history.

(56) References Cited

U.S. PATENT DOCUMENTS

| | | | |
|---|---|---|---|
| 6,992,026 B2* | 1/2006 | Fukuyo et al. | 438/797 |
| 7,763,526 B2* | 7/2010 | Tamura et al. | 438/463 |
| 8,124,551 B2 | 2/2012 | Hashimoto | |
| 8,523,636 B2* | 9/2013 | Uchiyama | 451/57 |
| 2003/0148057 A1* | 8/2003 | Dietz et al. | 428/43 |
| 2009/0203513 A1 | 8/2009 | Hashimoto | |
| 2010/0206008 A1* | 8/2010 | Harvey et al. | 65/105 |

FOREIGN PATENT DOCUMENTS

| | | | |
|---|---|---|---|
| JP | 06-021292 A | | 1/1994 |
| JP | 2002-087834 A | | 3/2002 |
| JP | 2004-067443 A | | 3/2004 |
| JP | 2006-278274 A | | 10/2006 |
| JP | 2009-211042 A | | 9/2009 |

OTHER PUBLICATIONS

Ahmed, F. et al., "Display glass cutting by femtosecond laser induced single shot periodic void array," Appl. Phys. A 93: 189-192, (2008).*

* cited by examiner

*Primary Examiner* — Tom Thomas
*Assistant Examiner* — John Bodnar
(74) *Attorney, Agent, or Firm* — Fitzpatrick, Cella, Harper & Scinto (57) ABSTRACT

A light-transmissive member has a first principal face, a second principal face, and side faces. The first principal face has a first portion including a center of the first principal face and a second portion between the first portion and the side face sides. The member includes a plurality of altered portions formed between the first principal face and the second principal face so that the plurality of altered portions do not appear on the first principal face, the second principal face, and the side faces. Orthogonal projections of the plurality of altered portions onto the first principal face are included in the second portion.

13 Claims, 11 Drawing Sheets

FIG. 11B

# LIGHT-TRANSMISSIVE MEMBER, OPTICAL DEVICE, AND MANUFACTURING METHODS THEREOF

BACKGROUND OF THE INVENTION

1. Field of the Invention

The present invention relates to a light-transmissive member, an optical device including the same, and manufacturing methods thereof.

2. Description of the Related Art

Various light-transmissive members are used as a protection member to protect an optical member such as an image sensor and as a low-pass filter. The light-transmissive member can be diced by a dicing method such as wheel scribing or laser scribing in correspondence with a shape of an optical element such as an image sensor or light-emitting element to be combined with that member.

Japanese Patent Laid-Open No. 2004-67443 discloses a technique for improving a crack resistance by irradiating glass with an electron beam to increase the flexibility of a net-like structure of a surface layer of the glass. Japanese Patent Laid-Open No. 6-21292 discloses a technique for forming a highly-strained layer by ion implantation in an outer portion of a semiconductor pellet which is formed with an element portion and is made up of silicon. This highly-strained layer functions to block a crack from spreading to the element portion.

SUMMARY OF THE INVENTION

The present invention provides a technique advantageous to suppress progression of a crack.

One of the aspects of the present invention provides a light-transmissive member, which has a first principal face, a second principal face, and side faces, the first principal face having a first portion including a center of the first principal face and a second portion between the first portion and the side face sides, the member comprising: a plurality of altered portions formed between the first principal face and the second principal face so that the plurality of altered portions do not appear on the first principal face, the second principal face, and the side faces, wherein orthogonal projections of the plurality of altered portions onto the first principal face are included in the second portion.

Further features of the present invention will become apparent from the following description of exemplary embodiments with reference to the attached drawings.

DESCRIPTION OF THE EMBODIMENTS

A crack is often generated in a light-transmissive member such as glass or quartz when that member is cut off. The present invention provides a technique advantageous to suppress progression of a crack. Some embodiments of the present invention will be exemplarily explained hereinafter with reference to the accompanying drawings. However, the present invention is not limited to these embodiments.

Figure 1A:
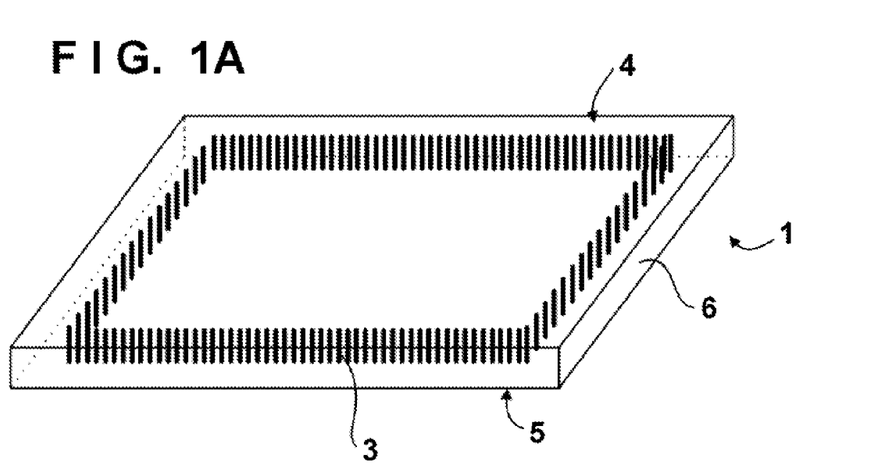
FIGS. 1A to 1C are views showing the configuration of a light-transmissive member according to the first embodiment.
Figure 1B:
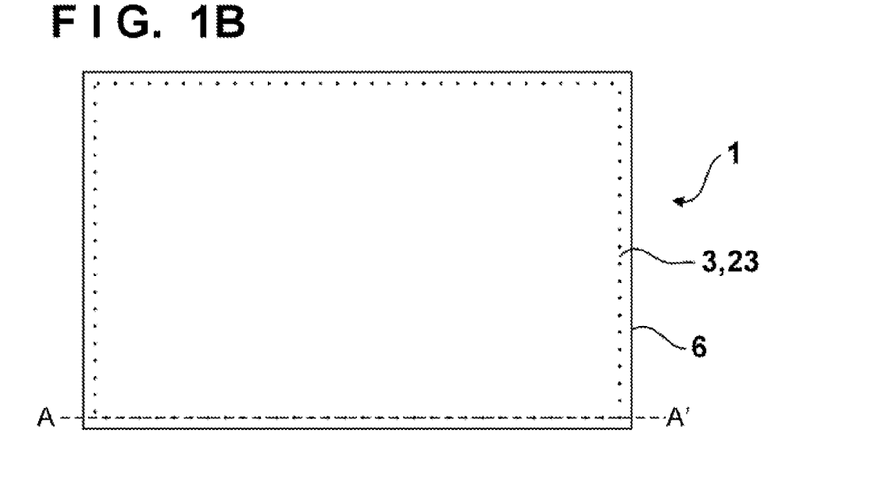
Figure 1C:
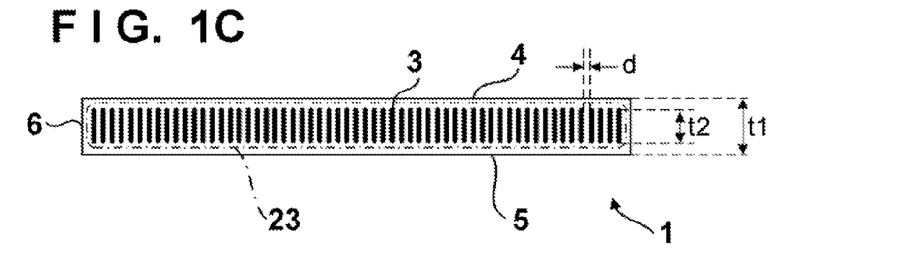

A light-transmissive member 1 according to the first embodiment of the present invention will be described below with reference to FIGS. 1A to 1C, FIGS. 2A and 2B, FIGS. 3A to 3C, and FIGS. 4A to 4C. FIG. 1A is a perspective view of the light-transmissive member 1, FIG. 1B is a plan view of the light-transmissive member 1, and FIG. 1C is a sectional view of the light-transmissive member 1 taken along a line A-A' in FIG. 1B. The light-transmissive member 1 can be configured by one material selected from the group consisting of glass, quartz, and lithium niobate. The light-transmissive member 1 can have a first principal face 4, second principal face 5, and side faces 6. The first and second principal faces 4 and 5 are those which are opposite to each other. The light-transmissive member 1 can typically include four sides. That is, the side faces 6 can typically include four planes.

The light-transmissive member 1 has a plurality of altered portions 3 formed between the first and second principal faces 4 and 5 so that they do not appear on the first and second principal faces 4 and 5 and side faces 6. In this case, the plurality of altered portions 3 can be regularly arranged between the first and second principal faces 4 and 5. Note that lattice defects, which may be unintendedly formed in the light-transmissive member 1, are randomly arranged and are not regularly arranged in general. At least some of the plurality of altered portions 3 can be arranged to configure an arrangement plane 23 by their set. The arrangement plane 23 can be laid out to surround a central portion of the light-transmissive member 1. In the example shown in FIGS. 1A to 1C, the arrangement plane 23 includes planes parallel to the respective sides of the rectangular light-transmissive member 1 including the four sides. The plurality of altered portions 3 are advantageous to suppress progression of a crack from an outer edge (that of the first or second principal face 4 or 5 or the side faces 6) of the light-transmissive member 1.

Each altered portion 3 has a property different from that of remaining portions (portions other than the altered portions 3) of the light-transmissive member 1. More specifically, each altered portion 3 can be, for example, a portion having an atomic or molecular bonding state different from the remaining portions, a portion having an atomic or molecular density different from the remaining portions, a portion having a lattice defect (for example, dislocation or grain), or a void. In particular, each altered portion 3 is preferably a portion having an atomic or molecular bonding state weaker than the remaining portions, a portion having an atomic or molecular density lower than the remaining portions, a portion having a lattice defect (for example, dislocation or grain), or a void.

As described above, the altered portions 3 are formed so as not to appear on the first and second principal faces 4 and 5 and side faces 6. In other word, the altered portions 3 are covered and surrounded by the remaining portions. Thus, the resistance against a stress acting on the light-transmissive member 1 can be enhanced. Unlike this case, when the altered portions 3 are formed to appear on at least one of the first and second principal faces 4 and 5 and side faces 6, the light-transmissive member 1 is readily damaged by a stress acting on the light-transmissive member 1. The first principal face 4 can be considered as having a first portion including the center of the first principal face and a second portion between the first portion and the side faces 6. The altered portions 3 are formed in the second portion. That is, orthogonal projections of the altered portions 3 onto the first principal face 4 are included in the second portion.

A width t2 of a region, in which the plurality of altered portions 3 are arranged, in a direction perpendicular to the first principal face 4 is preferably 30% or more and 70% or less of a thickness t1 of the light-transmissive member 1 as a distance between the first and second principal faces 4 and 5. If t2/t1>70%, the strength of the light-transmissive member 1 may become low. If t2/t1<30%, a probability of the presence of the altered portions 3 in a progression route of a crack becomes small, and a crack is more likely to progress toward the central portion of the light-transmissive member 1.

The plurality of altered portions 3 can be formed by, for example, focusing a laser beam by a laser device such as a YAG laser device to the interior of a light-transmissive member having no altered portion 3, and scanning that focusing position (focal point).

When a minimum distance d between neighboring altered portions 3 of the plurality of altered portions 3 is large, since a crack may penetrate through a gap between the neighboring altered portions 3 at a high possibility, the crack progression suppression effect may lower. On the other hand, when the minimum distance d becomes small, the intensity of the light-transmissive member 1 may lower. Hence, the minimum distance d preferably falls within a range from not less than 10 μm to not more than 100 μm.

Figure 2A:
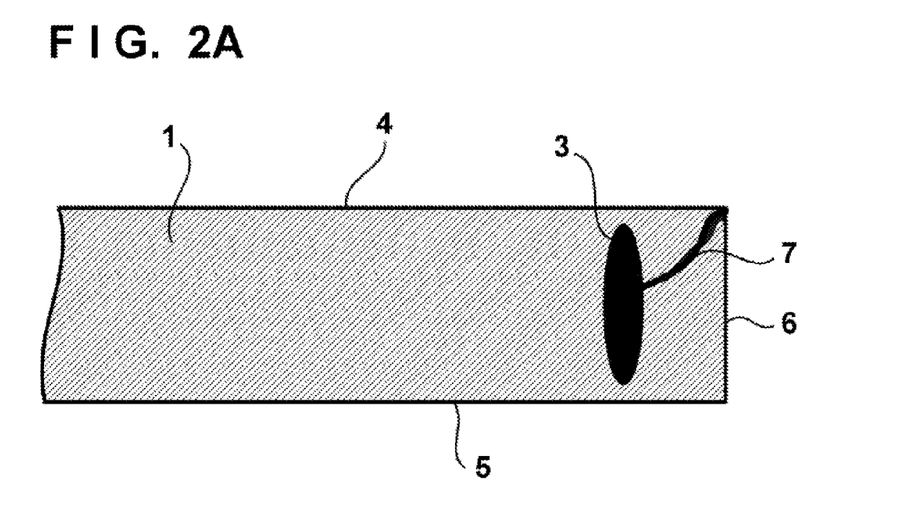
FIGS. 2A and 2B are views illustrating a crack progression suppression effect in the light-transmissive member according to the first embodiment.
Figure 2B:
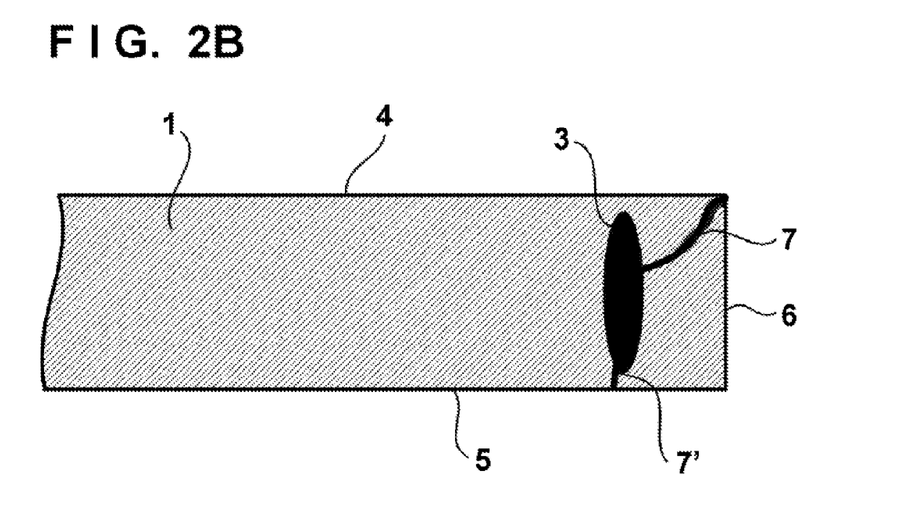

The crack progression suppression effect according to the first embodiment will be described below with reference to FIGS. 2A and 2B and FIGS. 11A and 11B. FIGS. 2A and 2B illustrate the progression suppression effect of a crack 7 according to the first embodiment. The crack 7 progresses from a state shown in FIG. 2A to that shown in FIG. 2B. The progression direction of the crack 7, which progresses from the outer edge of the light-transmissive member 1 in an inner direction, as illustrated in FIG. 2A, is changed to a direction of the second principal face 5, as illustrated in FIG. 2B. Thus, the crack 7 can be prevented from progressing toward the central portion of the light-transmissive member 1. In this case, the crack 7, which has reached the altered portion 3, normally exits the altered portion 3 after it progresses along the altered portion 3, thereby changing the progression direction of the crack 7. Although not shown in FIGS. 2A and 2B, the progression direction of the crack 7, which has reached the altered portion 3, may be changed to a direction toward the first principal face 4 in some cases.

Figure 11A:
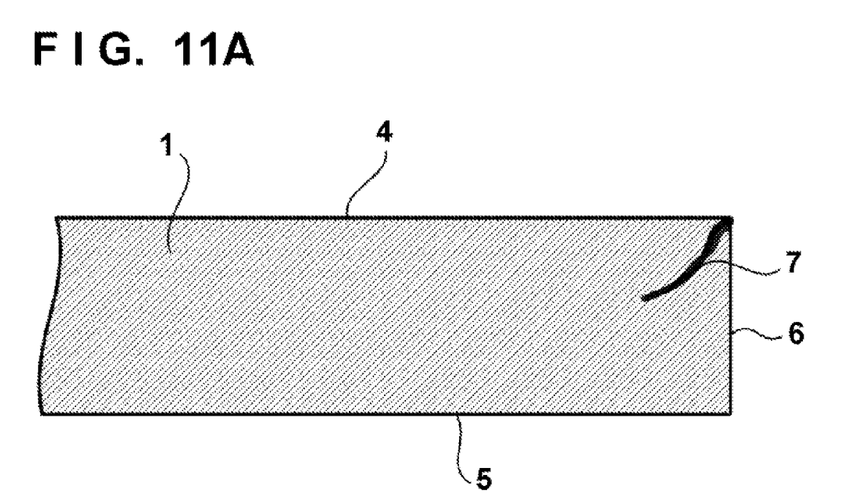
FIGS. 11A and 11B are views illustrating progression of a crack in a comparative example.
Figure 11B:
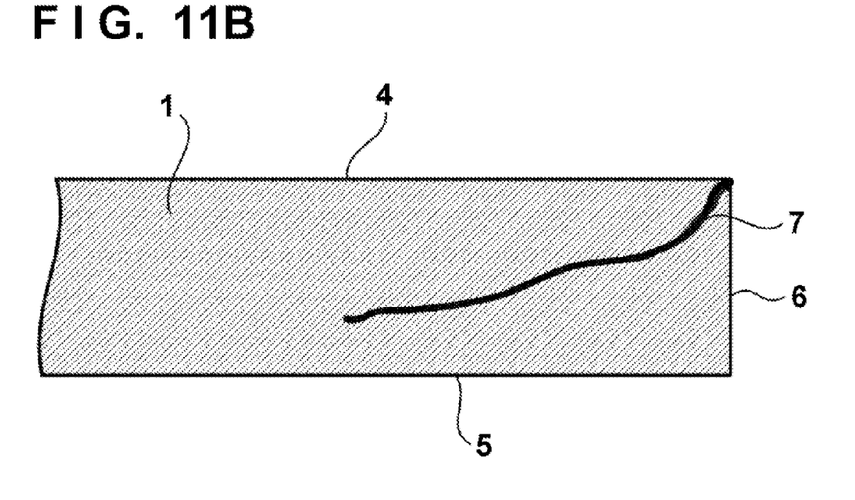

FIGS. 11A and 11B illustrate the progression of the crack 7 in the light-transmissive member 1 having no altered portion 3. The crack 7 progresses from a state shown in FIG. 11A to that shown in FIG. 11B.

Figure 3A:
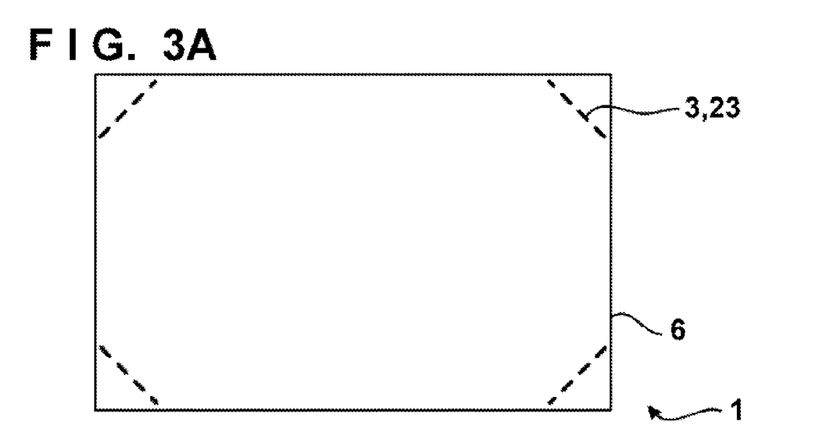
FIGS. 3A to 3C are views showing the configuration of the light-transmissive member according to the first embodiment.
Figure 3B:
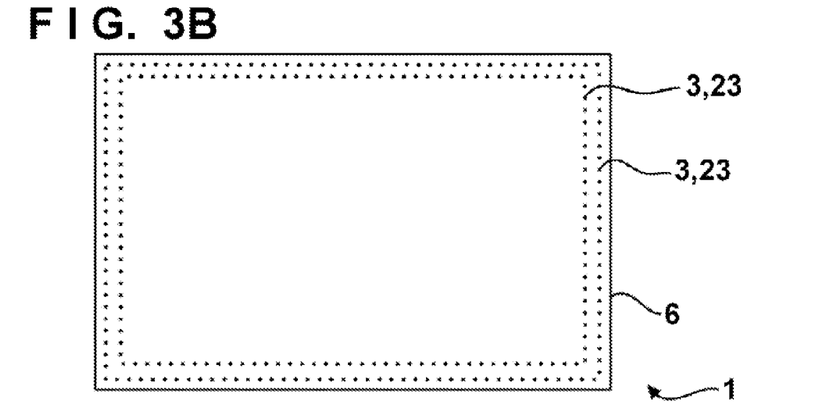
Figure 3C:
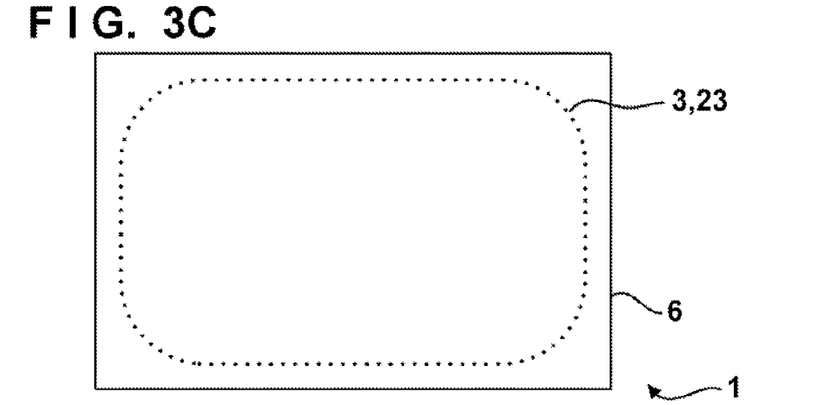

FIGS. 3A to 3C show the arrangements of the plurality of altered portions 3, that is, another three examples of layouts of the arrangement planes 23. In the example of FIG. 3A, the arrangement of the plurality of altered portions 3 includes four arrangement planes 23 laid out at four corner portions of the rectangular light-transmissive member 1. In this example, each arrangement plane 23 is laid out so that its normal points to the central portion of the light-transmissive member 1. In the example of FIG. 3B, the arrangement of the plurality of altered portions 3 includes two arrangement planes 23 which are laid out to doubly surround the central portion of the light-transmissive member 1. The arrangement of the plurality of altered portions 3 may include triple or more arrangement planes 23 which surround the central portion of the light-transmissive member 1. In the example of FIG. 3C, the arrangement of the plurality of altered portions 3 includes an arrangement plane 23 which surrounds the central portion of the light-transmissive member 1 as a continuous curved plane.

Figure 4A:
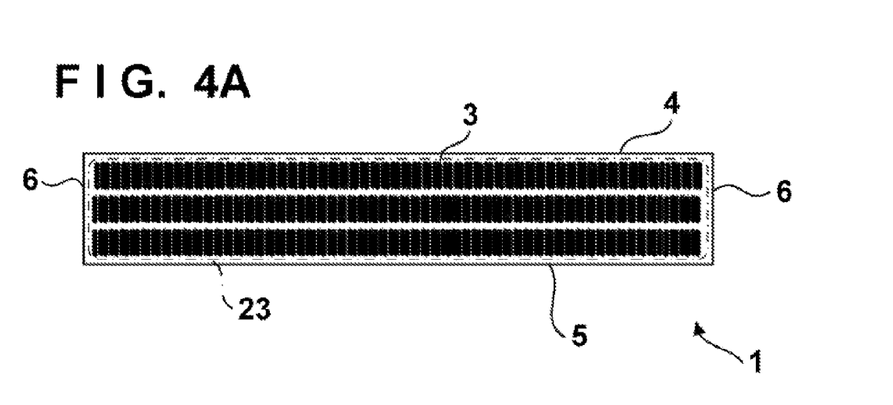
FIGS. 4A to 4C are views showing the configuration of the light-transmissive member according to the first embodiment.
Figure 4B:
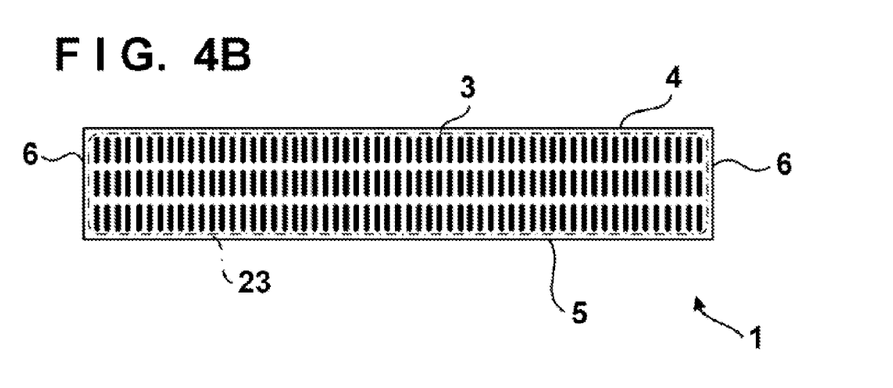
Figure 4C:
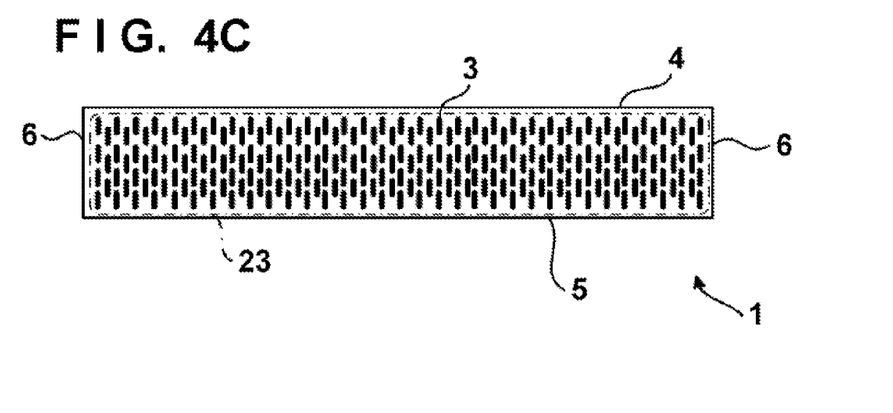

FIGS. 4A to 4C show three examples of the arrangements of the plurality of altered portions 3 in the arrangement plane 23. In the example shown in FIG. 4A, the arrangement of the plurality of altered portions 3 includes altered portions 3 which are continuously arranged in a direction along the first and second principal faces 4 and 5, and are intermittently arranged in a direction perpendicular to that direction. In the example shown in FIG. 4B, the arrangement of the plurality of altered portions 3 includes altered portions 3 which are intermittently arranged in the direction along the first and second principal faces 4 and 5 and in the direction perpendicular to that direction. In the example shown in FIG. 4C, the arrangement of the plurality of altered portions 3 includes altered portions 3 which are arranged in a zigzag pattern in the arrangement plane 23. The example shown in FIG. 4C is advantageous to enhance the crack progression suppression effect by improving the arrangement density of the altered portions 3, and also to suppress an intensity reduction of the light-transmissive member 1.

Figure 5A:
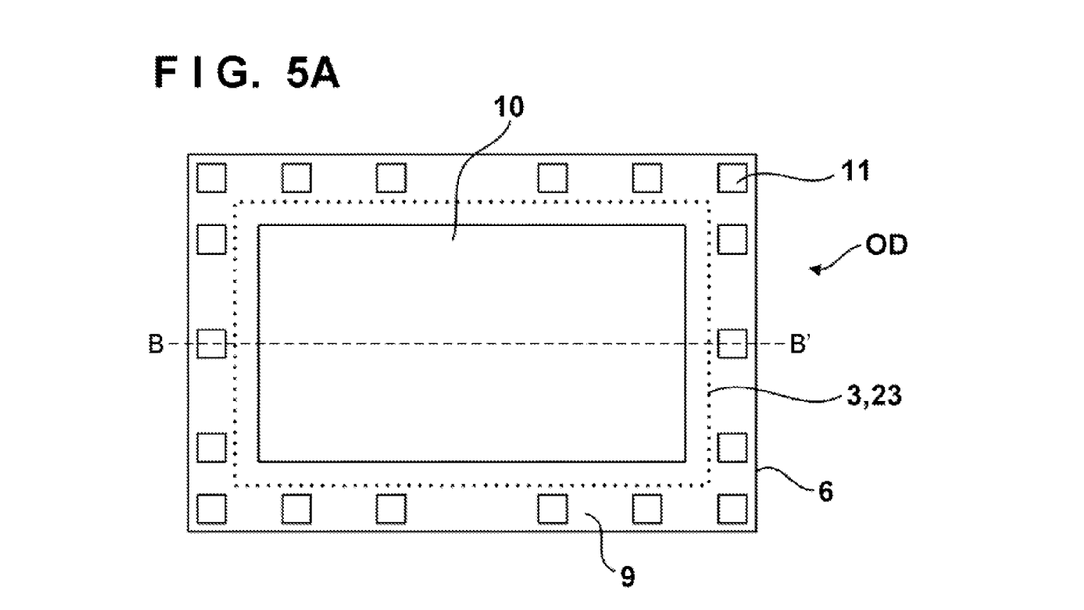
FIGS. 5A and 5B are views showing the configuration of an optical device according to the second embodiment.
Figure 5B:
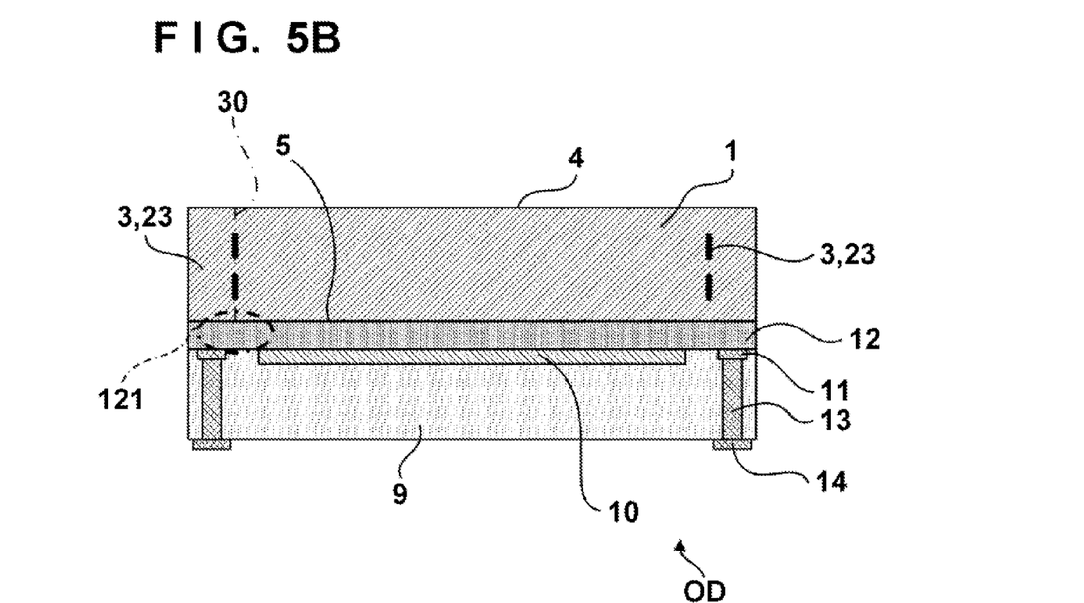

The second embodiment of the present invention will be described below with reference to FIGS. 5A and 5B and FIGS. 6A to 6C. Items which are not mentioned in the description of the second embodiment may conform to the first embodiment. The second embodiment provides an optical device OD including a light-transmissive member 1 represented by the first embodiment. FIG. 5A is a plan view of the optical device OD, and FIG. 5B is a sectional view taken along a line B-B' in FIG. 5A. Note that FIG. 5A does not illustrate a light-transmissive member 1 having light transmission characteristics. The optical device OD includes an optical element 9 and the light-transmissive member 1, which is laid out so that the second principal face 5 faces the optical element 9. The optical element 9 can be, for example, an image sensor (for example, a CMOS sensor or CCD sensor) or a light-emitting element (for example, an LED or laser). In one example, the optical element 9 is an image sensor, and can have a configuration which has a pixel array region 10 and pads 11 on one face and external terminals 14 on the other face, and in which the pads 11 and external terminals 14 are connected via through electrodes 13. The light-transmissive member 1 has a plurality of altered portions 3 (or an arrangement plane 23 formed by arranging them), as described above.

Since the optical device OD is configured using the light-transmissive member 1 having the altered portions 3, even when a crack is generated at the outer edge of the light-transmissive member 1, it can be suppressed from progressing to the central portion of the light-transmissive member 1.

Thus, light transmitted through the central portion of the light-transmissive member 1 can be prevented from being influenced by the crack. For example, when the optical element 9 is an image sensor, if a crack progresses to the central portion (or imaging region) of the light-transmissive member 1, it may deteriorate an image to be captured, but the altered portions 3 can prevent this. For example, when the optical element 9 is a light-emitting element, if a crack progresses to the central portion of the light-transmissive member 1, it may cause a non-uniform intensity distribution of light radiated via the light-transmissive member 1, but the altered portions 3 can prevent this.

The optical device OD can further include a resin member 12, as an organic member 12, which is laid out between the optical element 9 and light-transmissive member 1 so as to contact the second principal face 5 of the light-transmissive member 1. In this case, at least some of the plurality of altered portions 3 are arranged in an imaginary plane 30, which intersects with the second principal face 5 of the light-transmissive member 1, and the resin member 12 can include a sealing portion 121 which covers a line of intersection between the second principal face 5 and imaginary plane 30. The sealing portion 121 seals the line of intersection of the light-transmissive member 1 and a portion around it. That is, orthogonal projections of the second portion of the light-transmissive member 1, the outer region of the optical element 9, and the organic member 12 onto the first principal are overlapping with each other. With this configuration, even when a crack is generated in the light-transmissive member 1 and reaches the line of intersection of the second principal face 5 or the vicinity of it via the altered portions 3, the sealing portion 121 can prevent a portion of the light-transmissive member 1 from dropping due to the crack.

A manufacturing method of the optical device OD of the second embodiment will be described below with reference to FIGS. 6A to 6C. The optical device OD can be manufactured by dicing a substrate 150 into a plurality of chips. In this case, the substrate 150 has a configuration in which a semiconductor substrate 90 including a plurality of optical elements 9 and a light-transmissive substrate 100 having an area corresponding to a plurality of light-transmissive materials 1 are bonded via a resin member 120 having an area corresponding to a plurality of resin members 12. The manufacturing method of the optical device OD will be described in more detail below. The light-transmissive substrate 100 has first and second principal faces 4 and 5, which are common to the first and second principal faces 4 and 5 of the light-transmissive member 1 after dicing.

Figure 6A:
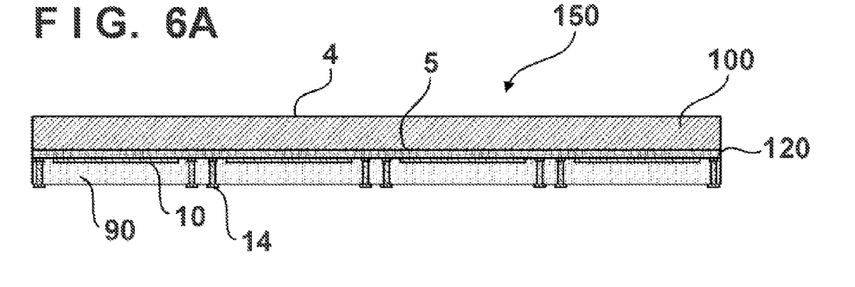
FIGS. 6A to 6C are views showing the manufacturing method of the optical device according to the second embodiment.
Figure 6B:
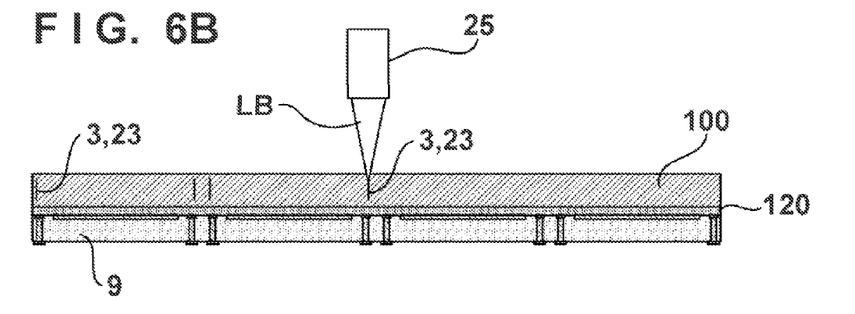
Figure 6C:
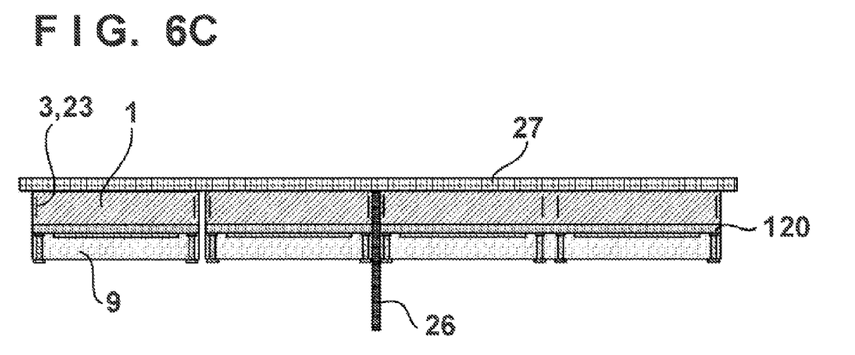

In a process shown in FIG. 6A, the semiconductor substrate 90 and light-transmissive substrate 100 are prepared, and they are connected via the resin member 120. As the resin member 120, for example, a sealing resin can be used. In a process shown in FIG. 6B, a plurality of altered portions 3 (arrangement planes 23) are formed in prospective regions of respective light-transmissive members 1 of the light-transmissive substrate 100 using a laser irradiation device 25. The plurality of altered portions 3 to be formed in this process are formed between the first and second principal faces 4 and 5 so as not to appear on the first and second principal faces 4 and 5 and side faces 6. In a process shown in FIG. 6C, a dicing tape 27 is adhered to the substrate 150 (for example, the light-transmissive substrate 100), and the substrate 150 is diced or cut off using a dicing blade 26, so that the altered portions 3 do not appear on prospective portions of the side faces 6. Thus, the substrate 150 is divided into a plurality of optical devices OD. With this dicing, a crack may be generated at an outer edge of each light-transmissive member 1, that is, at the diced portion. However, this crack can be suppressed by the altered portions 3 from progressing to the central portion of the light-transmissive member 1. Thus, progression of a crack can be suppressed at the time of dicing of the substrate 150 or at an operation/convey timing of the optical device OD later. In this way, the optical devices OD can be manufactured with a high yield.

The manufacturing method of the optical device OD has been explained. However, it can be understood that this manufacturing method includes that of the light-transmissive member 1 having the plurality of altered portions 3.

Figure 7A:
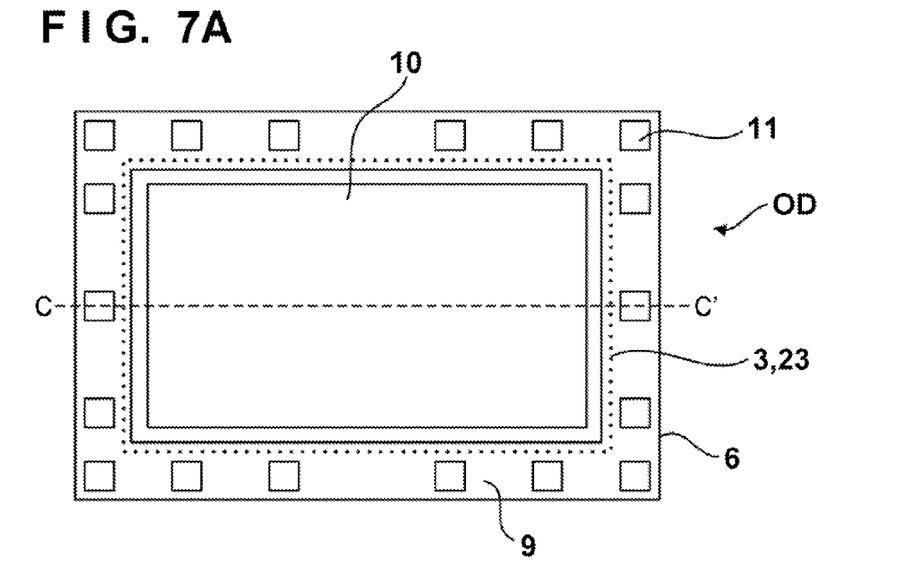
FIGS. 7A and 7B are views showing the configuration of an optical device according to the third embodiment.
Figure 7B:
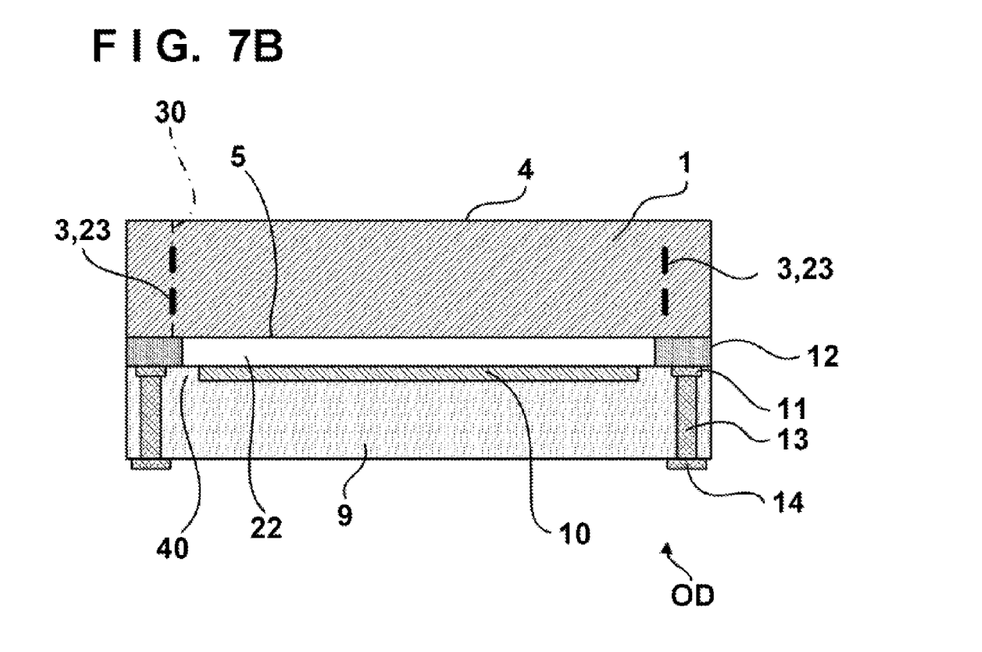

The third embodiment of the present invention will be described below with reference to FIGS. 7A and 7B. FIG. 7A is a plan view of an optical device OD, and FIG. 7B is a sectional view taken along a line C-C' in FIG. 7A. Note that FIG. 7A does not illustrate a light-transmissive member 1 having light transmission characteristics. The optical device OD of the third embodiment is different from the second embodiment in that an outer region 40 which surrounds a pixel array region 10 and the light-transmissive member 1 are bonded via a resin member 12 so as to form a space 22 between the pixel array region 10 and light-transmissive member 1. Items which are not mentioned particularly in this embodiment may conform to the second embodiment. Even in the third embodiment, since the light-transmissive member 1 includes altered portions 3, even when a crack is generated at an outer edge of the light-transmissive member 1, it can be suppressed from progressing to the central portion of the light-transmissive member 1. Thus, light transmitted through the central portion of the light-transmissive member 1 can be prevented from being influenced by the crack.

At least some of the plurality of altered portions 3 are arranged in an imaginary plane 30, which intersects with a second principal face 5 of the light-transmissive member 1, and the resin member 12 can include a sealing portion 121 which covers a line of intersection between the second principal face 5 and imaginary plane 30. The sealing portion 121 seals the line of intersection of the light-transmissive member 1 and a portion around it. With this configuration, even when a crack is generated in the light-transmissive member 1 and reaches the line of intersection of the second principal face 5 or the vicinity of it via the altered portions 3, the sealing portion 121 can prevent a portion of the light-transmissive member 1 from dropping due to the crack.

Figure 8A:
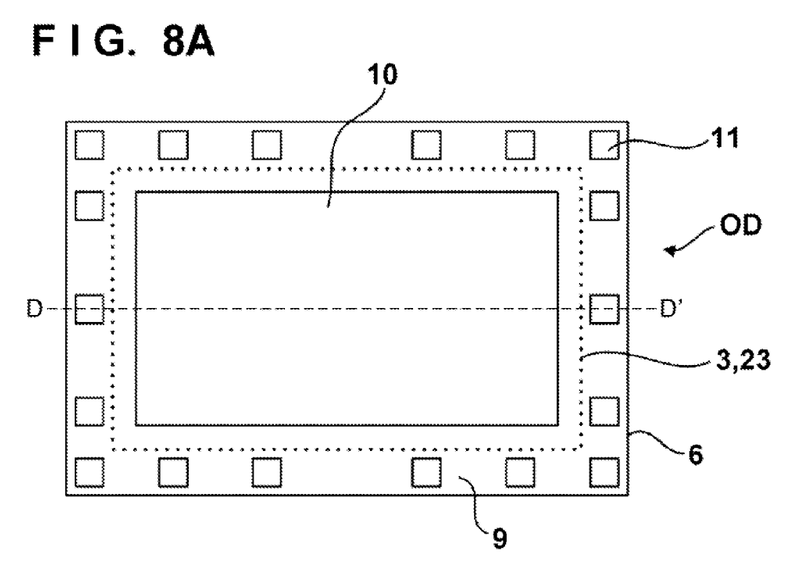
FIGS. 8A and 8B are views showing the configuration of an optical device according to the fourth embodiment.
Figure 8B:
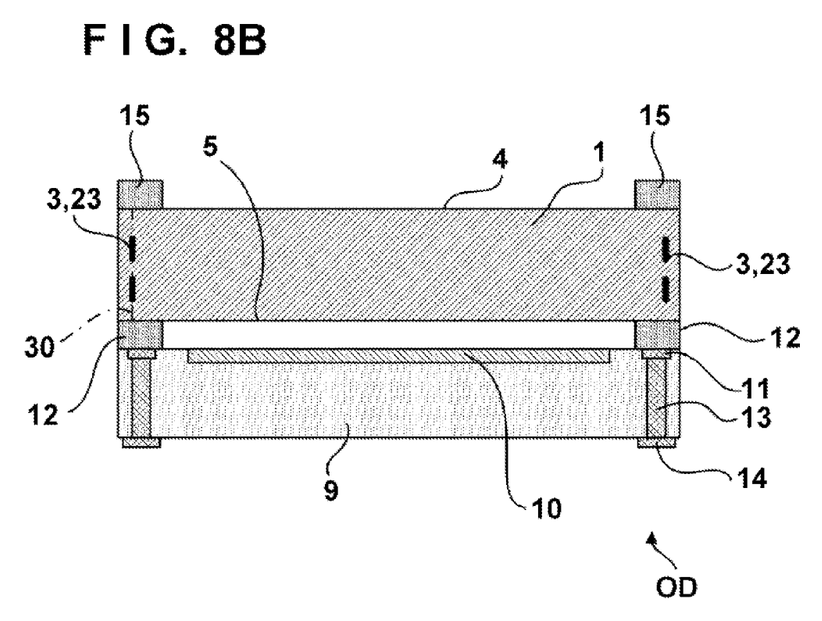

The fourth embodiment of the present invention will be described below with reference to FIGS. 8A and 8B. FIG. 8A is a plan view of an optical device OD, and FIG. 8B is a sectional view taken along a line D-D' of FIG. 8A. Note that FIG. 8A does not illustrate a light-transmissive member 1 having light transmission characteristics. An imaginary plane 30 in which at least some of a plurality of altered portions 3 are arranged intersects with first and second principal faces 4 and 5 of the light-transmissive member 1. The optical device OD of the fourth embodiment is different from the third embodiment in that the optical device OD includes a resin member 15 including a portion which covers a line of intersection between the first principal face 4 and imaginary plane 30. However, items which are not mentioned particularly in this embodiment may conform to the third embodiment.

According to the fourth embodiment, even when a crack is generated in the light-transmissive member 1 and reaches the line of intersection of the second principal face 5 or the vicinity of it via the altered portions 3, the resin members 12 and 15 can prevent a portion of the light-transmissive member 1 from dropping due to the crack.

Figure 9A:
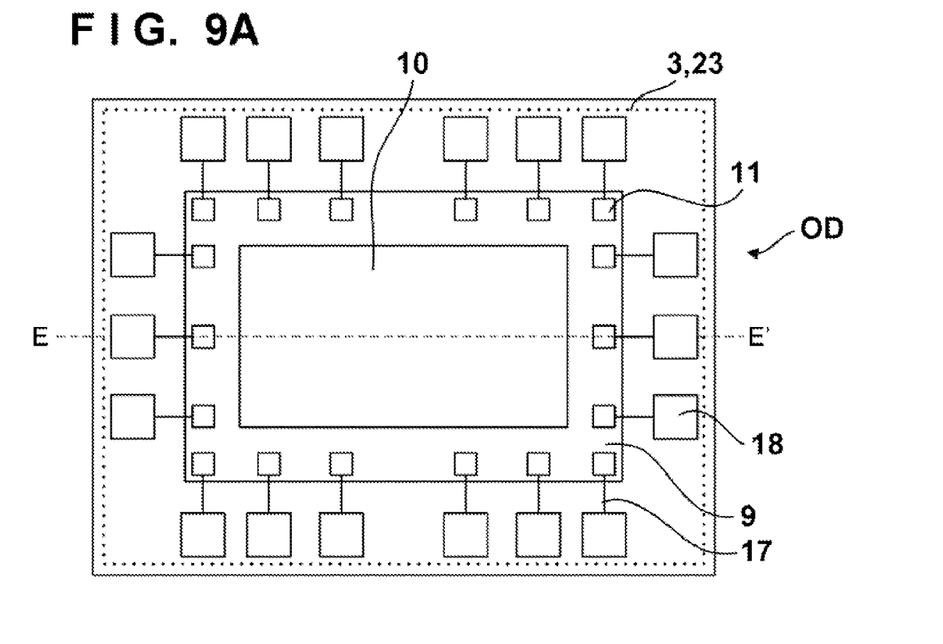
FIGS. 9A and 9B are views showing the configuration of an optical device according to the fifth embodiment.
Figure 9B:
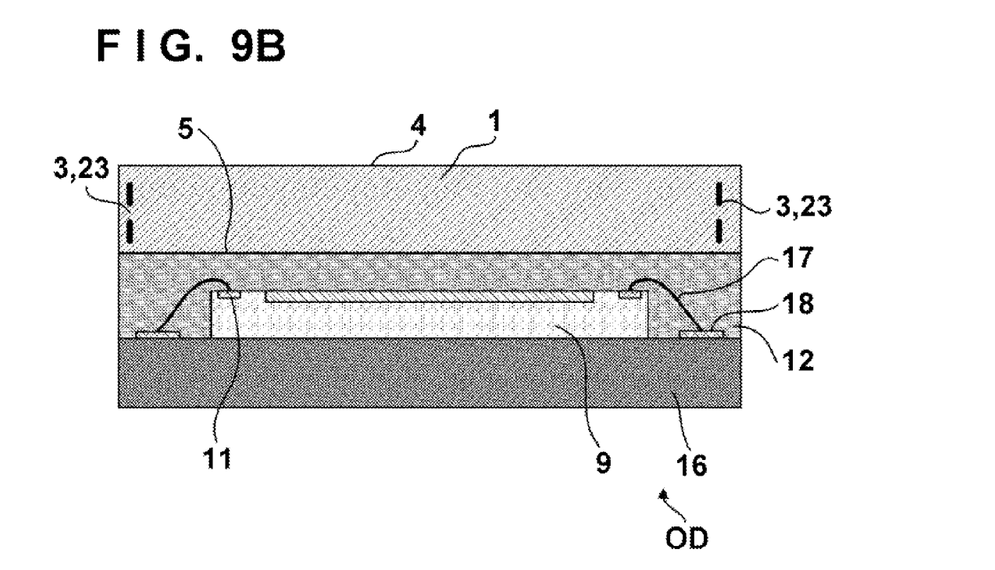

The fifth embodiment of the present invention will be described below with reference to FIGS. 9A and 9B. FIG. 9A is a plan view of an optical device OD, and FIG. 9B is a sectional view taken along a line E-E' in FIG. 9A. Note that FIG. 9A does not illustrate a light-transmissive member 1 having light transmission characteristics. In the fifth embodiment, the optical device OD is mounted on a substrate 16. The substrate 16 has substrate pads 18, and pads 11 provided to an optical element 9 and the substrate pads 18 are connected via metal wires 17. The optical element 9, substrate pads 18, and metal wires 17 are covered by a resin member 12, and the light-transmissive member 1 is laid out on the resin member 12. The resin member 12 seals the optical element 9, substrate pads 18, and metal wires 17, and connects the optical member 9 to the substrate 16 and light-transmissive member 1. The light-transmissive member 1 is formed with a plurality of altered portions 3, as described above.

The optical device OD of the fifth embodiment can also be manufactured by dicing a substrate including a plurality of optical devices OD as in the second embodiment. In the fifth embodiment as well, a crack may be generated at an outer edge of the light-transmissive member 1 by dicing, that is, at a diced portion. However, this crack can be suppressed by the altered portions 3 from progressing to the central portion of the light-transmissive member 1. In this manner, even when a crack is generated at the time of dicing of a substrate 150 or at an operation timing of the optical device OD later, progression of that crack can be suppressed. Thus, the optical devices OD can be manufactured with a high yield.

Figure 10A:
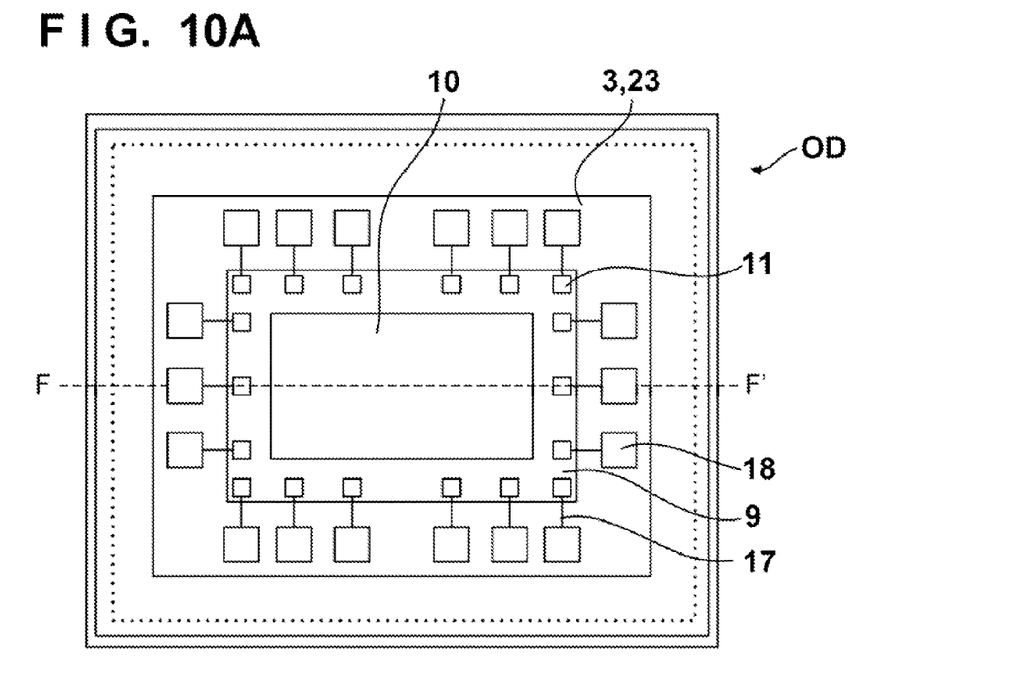
FIGS. 10A and 10B are views showing the configuration of an optical device according to the sixth embodiment.
Figure 10B:
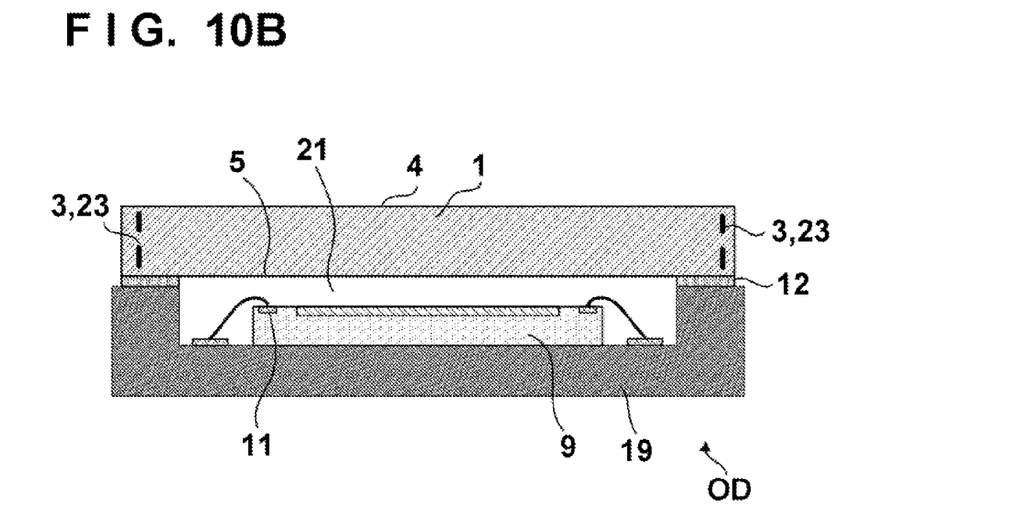

The sixth embodiment of the present invention will be described below with reference to FIGS. 10A and 10B. FIG. 10A is a plan view of an optical device OD, and FIG. 10B is a sectional view taken along a line F-F' in FIG. 10A. Note that FIG. 10A does not illustrate a light-transmissive member 1 having light transmission characteristics. The sixth embodiment is different from the fourth embodiment in that an optical element 9 is laid out in a cavity portion 21 of a cavity substrate 19. Items which are not mentioned particularly in this embodiment may conform to the fourth embodiment. According to the sixth embodiment, the same effects as in the fourth embodiment can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-191076, filed Sep. 1, 2011, which is hereby incorporated by reference herein in its entirety.

What is claimed is:

1. A light-transmissive member, which has (a) a first principal face, (b) a second principal face, and (c) four side faces, the member comprising:
   a plurality of altered portions formed between the first principal face and the second principal face so that the plurality of altered portions do not appear on the first principal face, the second principal face, and the four side faces,
   wherein the plurality of altered portions are arranged in four planes each of which is parallel to a respective one of the four side faces, the four planes being arranged in between the four side faces and a central portion of the member, the plurality of altered portions being arranged to surround the central portion of the member.

2. The member according to claim 1, wherein the member includes a region in which the plurality of altered portions are arranged, and
   wherein a width of the member, in a direction perpendicular to the first principal plane, falls within a range from not less than 30% to not more than 70% of a distance between the first principal face and the second principal face.

3. The member according to claim 1, wherein the plurality of altered portions comprises an altered portion including a void.

4. The member according to claim 1, wherein the plurality of altered portions comprises an altered portion including a portion formed by irradiation of a laser beam.

5. The member according to claim 1, wherein a minimum distance between neighboring altered portions of the plurality of altered portions falls within a range from not less than 10 μm to not more than 100 μm.

6. An optical device comprising:
   an optical element; and
   a light-transmissive member of claim 1,
   wherein the light-transmissive member is laid out so that the second principal face faces the optical element.

7. The device according to claim 6, further comprising an organic member laid out between the optical member and the light-transmissive member.

8. The device according to claim 6, wherein the optical member includes a pixel array region and an outer region which surrounds the pixel array region, and
   wherein the optical device further comprises an organic member which bonds the outer region and the light-transmissive member so that a space is formed between the pixel array region and the light-transmissive member.

9. The device according to claim 7, wherein at least some of the plurality of altered portions are arranged in an imaginary plane, which intersects with the second principal plane, and
   wherein the organic member includes a portion which covers a line of intersection between the second principal face and the imaginary plane.

10. The device according to claim 7, wherein at least some of the plurality of altered portions are arranged in an imaginary plane, which intersects with the first principal plane, and
    wherein the device further comprises an organic member including a portion which covers a line of intersection between the first principal face and the imaginary plane.

11. The member according to claim 1, wherein the plurality of altered portions include altered portions extending in a direction perpendicular to the first principal face.

12. An optical device comprising:
    an optical element including a pixel array region and an outer region which surrounds the pixel array region;
    a light-transmissive member of claim 1; and
    an organic member arranged between the optical element and the light-transmissive member,
    wherein orthogonal projections of the second portion, the outer region, and the organic member onto the first principal are overlapping with each other.
    obtaining the optical device by dicing the semiconductor substrate and the light-transmissive substrate so that the plurality of altered portions do not appear on prospective portions of side faces of the light-transmissive member.

13. A method of manufacturing a light-transmissive member, the method comprising:
    forming, along a first line, a plurality of altered portions in a light-transmissive substrate; and
    obtaining the light-transmissive member having side faces by dicing the light-transmissive substrate along a second line different from the first line, so that the plurality of altered portions do not appear on the side faces of the light-transmissive member.

* * * * *